United States Patent
Tai et al.

(10) Patent No.: US 10,432,169 B2
(45) Date of Patent: Oct. 1, 2019

(54) BONDED BODY AND ELASTIC WAVE ELEMENT

(71) Applicant: NGK INSULATORS, LTD., Nagoya, Aichi (JP)

(72) Inventors: Tomoyoshi Tai, Inazawa (JP); Masashi Goto, Nagoya (JP); Yudai Uno, Nagoya (JP); Shinya Kaneko, Okazaki (JP)

(73) Assignee: NGK INSULATORS, LTD., Nagoya, Aichi (JP)

( * ) Notice: Subject to any disclaimer, the term of this patent is extended or adjusted under 35 U.S.C. 154(b) by 0 days.

(21) Appl. No.: 16/135,655

(22) Filed: Sep. 19, 2018

(65) Prior Publication Data

US 2019/0036509 A1 Jan. 31, 2019

Related U.S. Application Data

(63) Continuation of application No. PCT/JP2017/006476, filed on Feb. 22, 2017.

(30) Foreign Application Priority Data

Mar. 25, 2016 (JP) .................... 2016-061713

(51) Int. Cl.
*H03H 9/02* (2006.01)
*H01L 41/09* (2006.01)
(Continued)

(52) U.S. Cl.
CPC ......... *H03H 9/02574* (2013.01); *H01L 41/09* (2013.01); *H01L 41/187* (2013.01);
(Continued)

(58) Field of Classification Search
CPC ........... H03H 9/02559; H03H 9/02574; H03H 9/02622; H03H 9/058; H03H 9/0585;
(Continued)

(56) References Cited

U.S. PATENT DOCUMENTS

| 7,213,314 B2 | 5/2007 | Abbott et al. |
| 7,331,092 B2 | 2/2008 | Miura et al. |

(Continued)

FOREIGN PATENT DOCUMENTS

| CN | 101849276 A | 9/2010 |
| JP | 3774782 B2 | 5/2006 |

(Continued)

OTHER PUBLICATIONS

International Preliminary Report on Patentability for PCT/JP2017/006476, dated Sep. 25, 2018 (1 page).

(Continued)

*Primary Examiner* — Barbara Summons
(74) *Attorney, Agent, or Firm* — Flynn Thiel, P.C.

(57) ABSTRACT

A bonded body includes a supporting body composed of a ceramic, a bonding layer provided over a surface of the supporting body and composed of one or more material selected from the group consisting of mullite, alumina, tantalum pentoxide, titanium oxide and niobium pentoxide, and a piezoelectric single crystal substrate bonded with the bonding layer. The surface of the supporting body has an arithmetic average roughness Ra of 0.5 nm or larger and 5.0 nm or smaller.

6 Claims, 4 Drawing Sheets

(51) Int. Cl.
*H01L 41/187* (2006.01)
*H01L 41/313* (2013.01)
*H01L 41/337* (2013.01)
*H03H 9/25* (2006.01)
*H03H 3/08* (2006.01)

(52) U.S. Cl.
CPC .......... *H01L 41/313* (2013.01); *H01L 41/337* (2013.01); *H03H 9/02559* (2013.01); *H03H 9/02622* (2013.01); *H03H 9/25* (2013.01); *H03H 3/08* (2013.01)

(58) Field of Classification Search
CPC ... H03H 9/09; H03H 9/25; H03H 3/08; H01L 41/09; H01L 41/187; H01L 41/312; H01L 41/313; H01L 41/332; H01L 41/337
USPC ................. 333/193–196; 310/313 R, 313 B
See application file for complete search history.

(56) References Cited

U.S. PATENT DOCUMENTS

| | | | |
|---|---|---|---|
| 7,736,993 B2 | 6/2010 | Allibert et al. | |
| 7,977,747 B2 | 7/2011 | Allibert et al. | |
| 8,264,303 B2 | 9/2012 | Suzuki | |
| 8,729,771 B2 | 5/2014 | Kobayashi et al. | |
| 8,866,365 B2 | 10/2014 | Hori et al. | |
| 8,936,998 B2 | 1/2015 | Utsumi et al. | |
| 9,680,083 B2 | 6/2017 | Hori et al. | |
| 2010/0276723 A1 | 11/2010 | Utsumi et al. | |
| 2015/0008789 A1 | 1/2015 | Iwamoto | |
| 2015/0365067 A1 | 12/2015 | Hori et al. | |
| 2016/0049469 A1 | 2/2016 | Yoshikawa et al. | |
| 2017/0063332 A1* | 3/2017 | Gilbert ............... | H03H 9/02574 |
| 2017/0063339 A1* | 3/2017 | Burak ................ | H03H 9/02574 |
| 2017/0085247 A1* | 3/2017 | Ruby ..................... | H03H 9/25 |
| 2018/0205361 A1* | 7/2018 | Kishimoto .......... | H01L 41/1873 |
| 2019/0007022 A1* | 1/2019 | Goto .................. | H03H 9/02559 |
| 2019/0036008 A1* | 1/2019 | Tai .......................... | H01L 41/09 |
| 2019/0036009 A1* | 1/2019 | Tai .......................... | H01L 41/39 |

FOREIGN PATENT DOCUMENTS

| | | |
|---|---|---|
| JP | 2010-187373 A | 8/2010 |
| JP | 3184763 U | 7/2013 |
| JP | 2014-086400 A | 5/2014 |
| JP | 2015/145054 A | 8/2015 |
| JP | 5814727 B2 | 11/2015 |
| KR | 1020070077438 A | 7/2007 |
| KR | 1020120035900 A | 4/2012 |
| KR | 1020150115020 A | 10/2015 |
| WO | WO 2011/158636 A1 | 12/2011 |
| WO | WO 2013/146374 A1 | 10/2013 |
| WO | WO 2014/010696 A1 | 1/2014 |
| WO | WO 2014/027538 A1 | 2/2014 |
| WO | WO 2014/192597 A1 | 12/2014 |

OTHER PUBLICATIONS

English translation of Written Opinion of the International Searching Authority for PCT/JP2017/006476, dated Apr. 4, 2017 (6 pages).
English language International Search Report for corresponding PCT/JP2017/006476 (2 pgs.), dated Apr. 4, 2017.
U.S. Appl. No. 16/135,577, filed Sep. 19, 2018.
U.S. Appl. No. 16/135,689, filed Sep. 19, 2018.
Office Action issued in Korean Patent Office in Korean Application No. 1020187022885 dated Mar. 4, 2019 (11 pages).
Chinese Office Action for corresponding application No. 201780013563.6, dated Apr. 23, 2019 (7 pages).

* cited by examiner

BONDED BODY AND ELASTIC WAVE ELEMENT

CROSS-REFERENCE TO RELATED APPLICATIONS

This is a continuation of International Application No. PCT/JP2017/006476, filed Feb. 22, 2017, which claims priority of Japanese Patent Application No. 2016-061713, filed Mar. 25, 2016, the entire contents of which are incorporated herein by reference.

TECHNICAL FIELD

The present invention relates to a bonded body of a piezoelectric single crystal substrate and a supporting body composed of a ceramic, and an acoustic wave device utilizing the same.

BACKGROUND ARTS

It is known a surface acoustic wave device functioning as a filter device or oscillator used in mobile phones or the like and an acoustic wave device such as lamb wave device or film bulk acoustic resonator (FBAR) using a piezoelectric thin film. As such acoustic wave device, it is known a device produced by adhering a supporting body and a piezoelectric substrate propagating a surface acoustic wave and by providing interdigitated electrodes capable of oscillating the surface acoustic wave on a surface of the piezoelectric substrate. By adhering the supporting body whose thermal expansion coefficient is lower than that of the piezoelectric substrate onto the piezoelectric substrate, the change of a size of the piezoelectric substrate responsive to temperature change is reduced so that the change of the frequency characteristics as the surface acoustic wave device is reduced.

For example, it is proposed, in patent document 1, a surface acoustic wave device having the structure produced by adhering a piezoelectric substrate and silicon substrate with an adhesive layer composed of an epoxy adhering agent.

Here, it is known that, in bonding a piezoelectric substrate and silicon substrate, a silicon oxide film is formed on a surface of the piezoelectric substrate, and a silicon substrate and the piezoelectric substrate are bonded through the silicon oxide film (patent document 2). In the bonding, plasma beam is irradiated onto the surfaces of the silicon oxide film and silicon substrate to activate the surfaces, followed by the direct boding (plasma activation method).

Further, it is known that a surface of the piezoelectric substrate is made a roughened surface, a filler layer is provided on the roughened surface to provide a flattened surface, and the filler layer is adhered onto a silicon substrate through an adhering layer (patent document 3). According to this method, an epoxy based or acryl based resin is used for the filler layer and adhering layer, and the bonding surface of the piezoelectric substrate is made the roughened surface to reduce the reflection of bulk wave and to reduce spurious wave.

Further, it is known direct bonding method of so-called FAB (Fast Atom Beam) system (patent document 4). According to this method, neutralized atomic beam is irradiated onto the respective bonding surfaces at ambient temperature to activate them, followed by direct bonding.

On the other hand, according to patent document 5, it is described that a piezoelectric single crystal substrate is directly bonded to a supporting body made of a ceramic (alumina, aluminum nitride, silicon nitride) and not to a silicon substrate, through an intermediate layer. A material of the intermediate layer is silicon, silicon oxide, silicon nitride or aluminum nitride.

On the other hand, according to a composite substrate described in patent document 6, in the case that a piezoelectric substrate and a supporting body are bonded through an organic adhesive layer, Rt (maximum cross sectional height of roughness curve) of a bonding surface of the supporting body to the piezoelectric substrate is made 5 nm or larger and 50 nm or smaller, so as to obtain the effect of preventing cracks by relaxing of a stress.

Further, according to patent document 3, in a surface acoustic wave device produced by adhering a piezoelectric substrate and a supporting body through an adhesive layer, unevenness is formed on a bonding surface of the piezoelectric substrate, a filling agent is applied on the bonding surface to form a filler layer, and the filler layer and supporting body are adhered. In this case, micro unevenness is provided on the bonding surface of the piezoelectric substrate to make the arithmetic average roughness 0.1 μm, so that spurious due to reflection of bulk wave is prevented. Further, Ra of the bonding surface of the supporting body is made 10 nm, so that the bonding strength of the supporting body and filler layer is improved.

PRIOR ART DOCUMENTS

Patent Documents (Patent document 1) Japanese Patent publication No. 2010-187373A
(Patent document 2) U.S. Pat. No. 7,213,314 B2
(Patent document 3) Japanese Patent No. 5814727 B
(Patent document 4) Japanese Patent publication No. 2014-086400A
(Patent document 5) Japanese Patent No. 3774782B
(Patent document 6) Japanese Utility Model Registered No. 3184763

SUMMARY OF THE INVENTION

Object to be Solved by Invention

However, in the case that the piezoelectric single crystal substrate is directly bonded to a supporting by made of a ceramic, cracks may be generated due to a difference of thermal expansion of the piezoelectric single crystal substrate and ceramic during heating after the bonding. According to the method described in patent document 5, a predetermined intermediate layer may be provided on a surface of a supporting body made of a ceramic, ionized beam is irradiated onto the bonding layer to activate it, and the bonding layer is directly bonded to the piezoelectric single crystal substrate. However, as the inventors actually tried to fabricate a bonded body, the bonding strength was proved to be still insufficient so that the separation occurred along an interface between the piezoelectric single crystal substrate and bonding layer during the subsequent processing steps.

Thus, the inventors studied material of the bonding layer or methods of processing a surface of the piezoelectric single crystal substrate for further improving the bonding strength of the bonding layer and piezoelectric single crystal substrate. However, separation may occur along an interface between the supporting body and bonding layer when the bonded body is subjected to subsequent steps.

An object of the present invention is, in providing a bonding layer on a supporting body composed of a ceramic and bonding the bonding layer and a piezoelectric single crystal substrate, to improve a bonding strength of the piezoelectric single crystal substrate and bonding layer and to prevent separation of the bonding layer and supporting body.

Means for Solving Object

The present invention provides a bonded body comprising:
a supporting body comprising a ceramic;
a bonding layer provided over a surface of the supporting body and comprising one or more material selected from the group consisting of mullite, alumina, tantalum pentoxide, titanium oxide and niobium pentoxide; and
a piezoelectric single crystal substrate bonded with the bonding layer,
wherein said surface of said supporting body has an arithmetic average roughness Ra of 0.5 nm or larger and 5.0 nm or smaller.

The present invention further provides an acoustic wave device comprising:
the bonded body and
an electrode provided on the piezoelectric single crystal substrate.

According to the present invention, in bonding a piezoelectric single crystal substrate and a supporting body made of a ceramic, it is provided a bonding layer composed of a material selected from the group consisting of mullite, alumina, tantalum pentoxide, titanium oxide and niobium pentoxide. It is thereby possible to improve a bonding strength of the piezoelectric single crystal substrate and bonding layer. At the same time, an arithmetic average roughness Ra of a surface of the supporting body is made 0.5 nm or larger and 5.0 nm or smaller, so that it is possible to prevent the separation at an interface of the supporting body and the specific bonding layer. Although the surface of the supporting body having Ra exceeding 5.0 nm is still said to be extremely smooth, it could have been still difficult to predict that the probability of the separation at the interface of the supporting body and specific bonding layer is considerably increased.

MODES FOR CARRYING OUT THE INVENTION

Figure 1A:
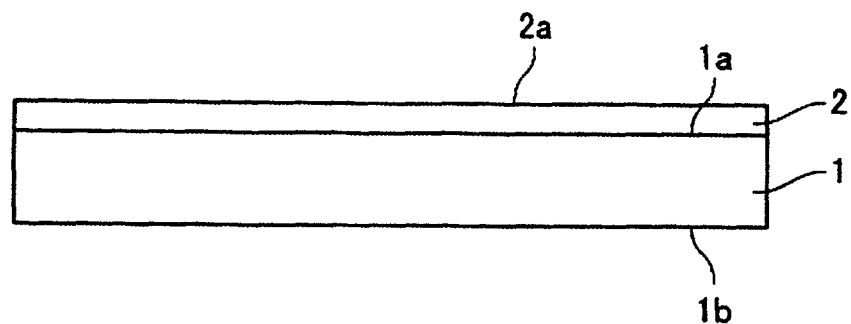
FIG. 1(a) shows the state that a bonding layer 2 is provided on a supporting body 1 made of a ceramic.

The present invention will be described in detail below, appropriately referring to the drawings.

FIGS. 1 and 2 relate to an embodiment that a bonding layer is provided on a supporting body and then bonded to a surface of a piezoelectric single crystal substrate by direct bonding.

Figure 1B:
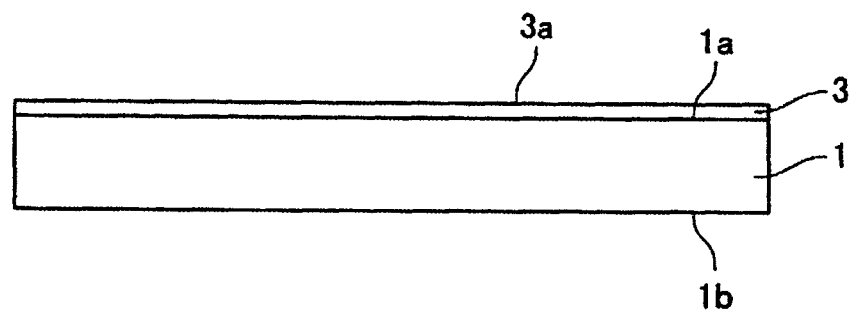
FIG. 1(b) shows the state that a surface 3a of a bonding layer 3 is subjected to flattening.

As shown in FIG. 1(a), a bonding layer 2 is provided on a surface 1a of a supporting body 1 made of a ceramic. 1b represents a surface on the opposite side. At this time, unevenness may be present on the surface 2a of the bonding layer 2.

Then, according to a preferred embodiment, the surface 2a of the bonding layer 2 is subjected to flattening process to form a flat surface 3a. By this flattening process, a thickness of the bonding layer 2 is usually lowered to a thinner bonding layer 3 (refer to FIG. 1(b)). However, the flattening process is not indispensable.

Figure 1C:
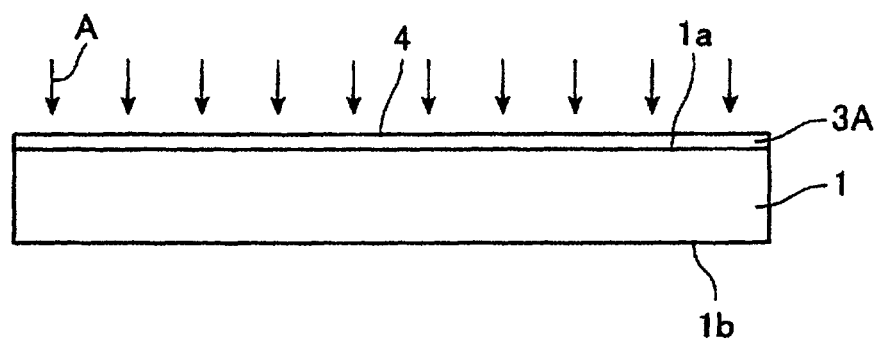
FIG. 1(c) shows the state that a flat surface 4 is activated by neutralized beam A.

Then, neutralized beam is irradiated onto the flat surface 3a as an arrow A, as shown in FIG. 1(c), to activate the surface of the bonding layer 3A to obtain an activated surface 4.

Figure 2A:
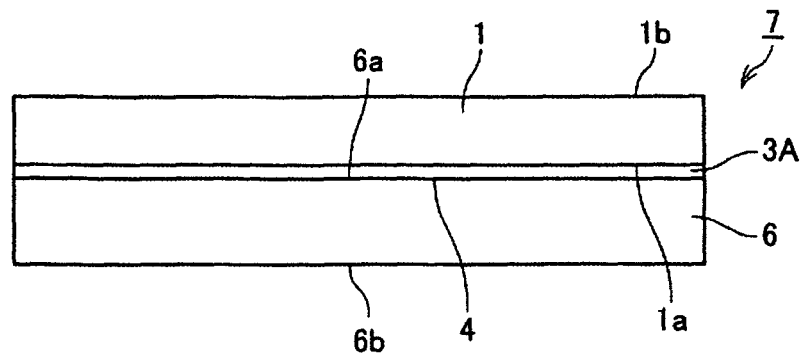
FIG. 2(a) shows the state that a piezoelectric single crystal substrate 6 and the supporting body 1 are bonded with each other.

On the other hand, as shown in FIG. 2(a), neutralized beam is irradiated onto a surface of a piezoelectric single crystal substrate 6 to activate it to provide an activated surface 6a. Then, the activated surface 6a of the piezoelectric single crystal substrate 6 and the activated surface 4 of the bonding layer 3A are bonded by direct bonding to obtain a bonded body 7.

Figure 2B:
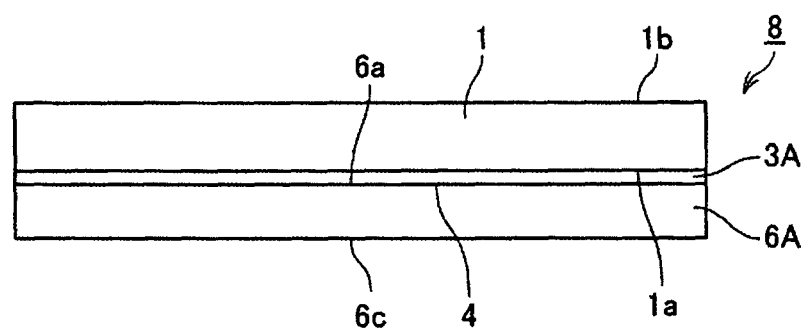
FIG. 2(b) shows the state that the piezoelectric single crystal substrate 6A is thinned by processing.

According to a preferred embodiment, the surface 6b of the piezoelectric single crystal substrate of the bonded body 7 is further subjected to polishing, so that the thickness of a piezoelectric single crystal substrate 6A is made smaller as shown in FIG. 2(b), providing a bonded body 8. A numeral 6c represents a polished surface.

Figure 2C:
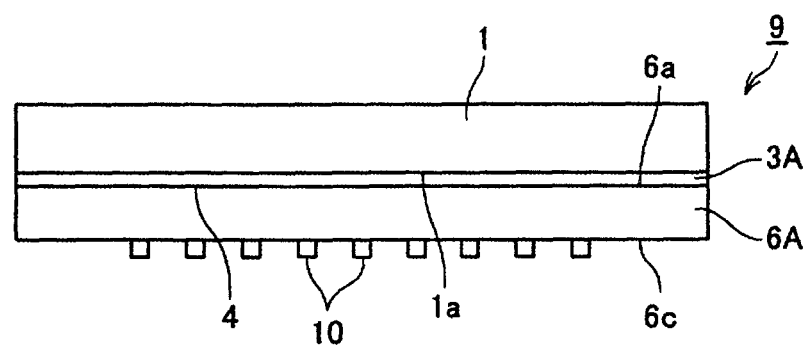
FIG. 2(c) shows the state that electrodes 10 are provided on a piezoelectric single crystal substrate 6A.

According to FIG. 2(c), predetermined electrodes 10 are formed on a polished surface 6c of the piezoelectric single crystal substrate 6A to produce an acoustic wave device 9.

Figure 3A:
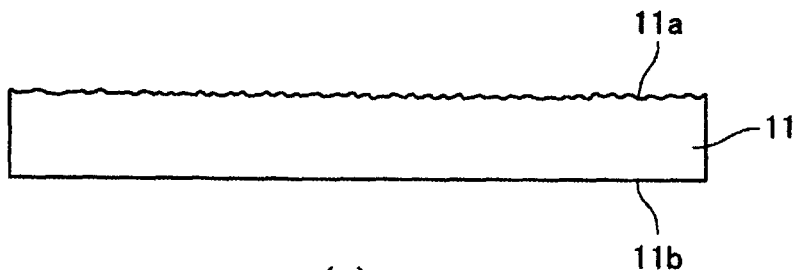
FIG. 3(a) shows the state that a surface 11a of a piezoelectric single crystal substrate 11 is made a roughened surface.
Figure 3B:
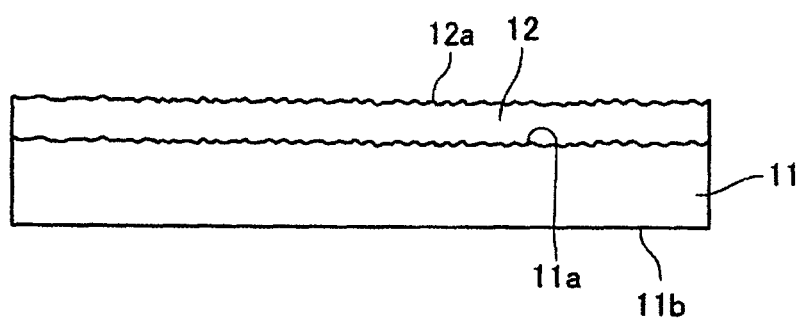
FIG. 3(b) shows the state that an intermediate layer 12 is provided on the roughened surface 11a, FIG. 3(c) shows the state that a surface 13a of an intermediate layer 13 is subjected to flattening process.
Figure 3C:
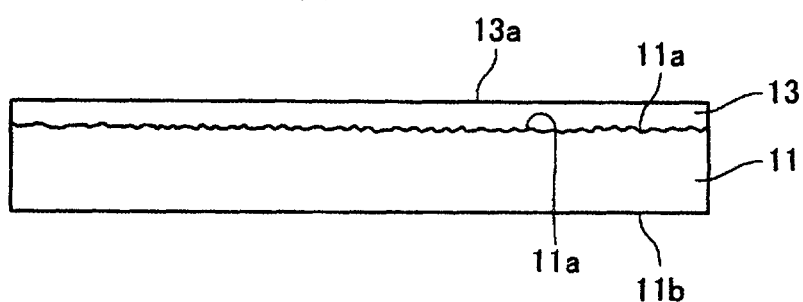
FIG. 3(d) shows the state that a flat surface 14 is activated by neutralized beam A.
Figure 3D:
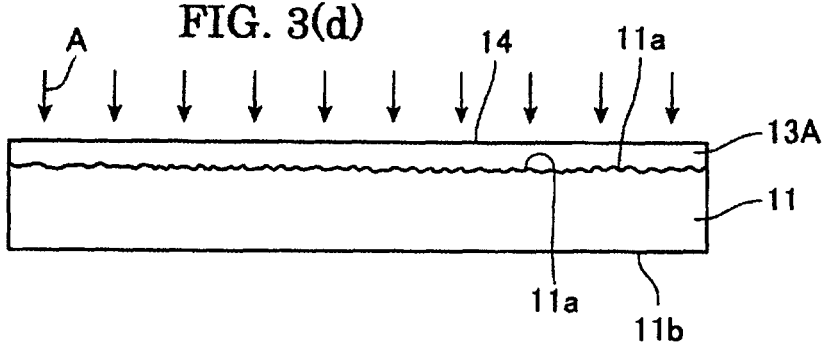
Figure 4A:
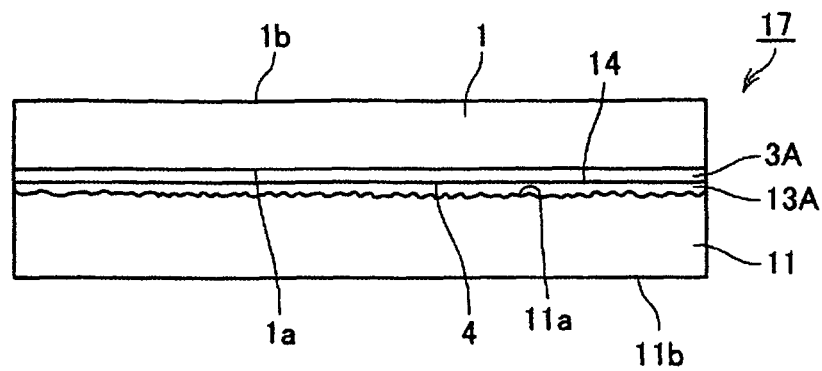
FIG. 4(a) shows the state that the piezoelectric single crystal substrate 11 and supporting body 1 are bonded with each other.
Figure 4B:
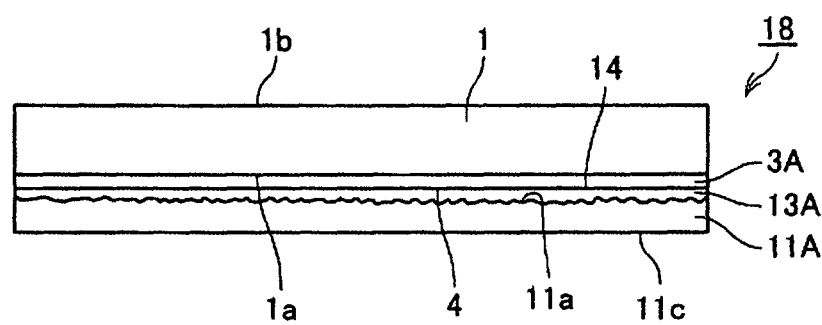
FIG. 4(b) shows the state that a piezoelectric single crystal substrate 11A is thinned by processing.
Figure 4C:
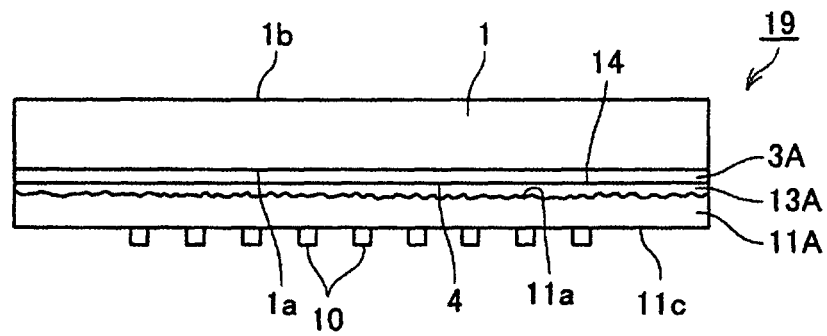
FIG. 4(c) shows the state that electrodes 10 are provided on a piezoelectric single crystal substrate 11A.

FIGS. 3 and 4 relate to an embodiment in which a surface of a piezoelectric single crystal substrate is made a roughened surface.

As shown in FIG. 3(a), a surface 11a of a piezoelectric single crystal substrate 11 is processed to forma roughened surface 11a. 11b represents a surface on the opposite side. Then, as shown in FIG. 3(b), an intermediate layer 12 is provided on the roughened surface 11a. At this time, the roughened surface is transcripted onto a surface 12a of the intermediate layer 12 and unevenness is formed.

Then, according to a preferred embodiment, the surface 12a of the intermediate layer 12 is subjected to flattening process to form a flat surface 13a as shown in FIG. 3(c). By this flattening process, a thickness of the bonding layer 12 is usually lowered to a thinner bonding layer 13. Then, neutralized beam is irradiated onto the flat surface 13a as an arrow A, as shown in FIG. 3(d), to activate the surface of the bonding layer 13A to obtain an activated surface 14.

On the other hand, as shown in FIG. 1(c), neutralized beam is irradiated onto a flat surface of a bonding layer 3A on the supporting body 1 to activate it to provide an activated surface 4. Then, the activated surface 4 of the bonding layer 3A and the activated surface 14 of the intermediate layer 13A are bonded by direct bonding to obtain a bonded body 17 (FIG. 4(*a*)).

According to a preferred embodiment, the surface 11*b* of the piezoelectric single crystal substrate of the bonded body 17 is further subjected to polishing, so that the thickness of the piezoelectric single crystal substrate 11A is made smaller as shown in FIG. 4(*b*), providing a bonded body 18. 11*c* represents a polished surface.

Further, in the case of a surface acoustic wave device 19 of FIG. 4(*c*), predetermined electrodes 10 are formed on a polished surface 11*c* of the piezoelectric single crystal substrate 11A.

Respective constituents of the present invention will be described further in detail below.

The supporting body is made of a ceramic material. The ceramic material may preferably be a material selected from the group consisting of mullite, cordierite and sialon.

According to the present invention, the bonding layer is provided on a surface of the supporting body. The bonding layer is made of a material selected from the group consisting of mullite, alumina, tantalum pentoxide, titanium oxide and niobium pentoxide, so that it is possible to improve the bonding strength of the bonding layer and piezoelectric single crystal substrate. Although the film-forming method of the bonding layer is not limited, sputtering, chemical vapor deposition (CVD) and vapor deposition are listed.

Specifically, as the material of the piezoelectric single crystal substrate, single crystals of lithium tantalate (LT), lithium niobate (LN), lithium niobate-lithium tantalate solid solution, quartz and lithium borate may be listed. Among them, LT or LN are more preferred. As LT or LN has a high propagation speed of a surface acoustic wave and large electro-mechanical coupling factor, it is preferred for use in a piezoelectric surface wave device for high frequency and wide-band frequency applications. Further, the normal direction of the main surface of the piezoelectric single crystal substrate is not particularly limited. However, in the case that the piezoelectric single crystal substrate is made of LT, for example, it is preferred to use the substrate rotated toward Y-axis or Z-axis by 36 to 47° (for example 42°) with respect to X-axis, which is a direction of propagation of a surface acoustic wave, because of a low propagation loss. In the case that the piezoelectric single crystal substrate is made of LN, it is preferred to use the substrate rotated toward Y-axis or Z-axis by 60 to 68° (for example 64°) with respect to X-axis, which is a direction of propagation of a surface acoustic wave, because of a lower propagation loss. Further, although the size of the piezoelectric single crystal substrate is not particularly limited, for example, the diameter may be 50 to 150 mm and thickness may be 0.2 to 60 µm.

According to the present invention, the arithmetic average roughness Ra of the surface of the supporting body is 0.5 nm or larger and 5.0 nm or smaller. It is thus possible to prevent the separation along the interface of the supporting body and bonding layer considerably. On the viewpoint, the arithmetic average roughness Ra of the surface of the supporting body may preferably be 0.8 nm or larger and 3.0 nm or smaller. Further, the arithmetic average roughness Ra is measured by an AFM (atomic force microscope) in a measured range of 10 µm×10 µm.

According to a preferred embodiment, the surface of the supporting body has a PV value of 10 nm or larger and 50 nm or smaller. The adhesive strength at the interface of the supporting body and bonding layer can be further improved. On the viewpoint, the PV value of the surface of the supporting body may more preferably be 20 nm or larger and more preferably be 30 nm or smaller. Further, PV values is defined as a value measured by an AFM (atomic force microscope) in a measured range of 10 µm×10 µm.

According to a preferred embodiment, the surface of the bonding layer and surface of the piezoelectric single crystal substrate are bonded by direct bonding. In this case, the arithmetic average roughness Ra of the surface of the bonding layer may preferably be 1 nm or smaller and more preferably be 0.3 nm or smaller. Further, the arithmetic average roughness Ra of the surface of the piezoelectric single crystal substrate may preferably be 1 nm or smaller and more preferably be 0.3 nm or smaller. The bonding strength of the piezoelectric single crystal substrate and bonding layer is thereby further improved.

The method of flattening the surfaces of the bonding layer and piezoelectric single crystal substrate include lapping, chemical mechanical polishing (CMP) and the like.

According to a preferred embodiment, an intermediate layer is provided between the piezoelectric single crystal substrate and bonding layer, the intermediate layer is made of a material selected from the group consisting of mullite, alumina, tantalum pentoxide, titanium oxide and niobium pentoxide, and the surface of the bonding layer and the surface of the intermediate layer are directly bonded. In this case, it is preferred to directly bond the surface of the piezoelectric single crystal substrate and intermediate layer.

According to this preferred embodiment, the surface of the piezoelectric single crystal substrate is a surface, in which unevenness is formed periodically and uniformly in a plane, having an arithmetic average roughness Ra of 0.05 µm or larger and 0.5 µm or smaller. It is thus possible to prevent spurious accompanied with the reflection at the interface of a bulk wave. According to a preferred embodiment, a height Ry from the lowest bottom of a valley to the highest peak of mountain of the surface of the piezoelectric single crystal substrate is 0.5 µm or larger and 5.0 µm or smaller. Specific roughness depends on a wavelength of an acoustic wave and appropriately selected so that the reflection of the bulk wave can be prevented.

Further, the method of roughening includes grinding, polishing, etching, sand blasting or the like.

Further, the material of the intermediate layer is selected from the group consisting of mullite, alumina, tantalum pentoxide, titanium oxide and niobium pentoxide. Although the film-forming method of the intermediate layer is not limited, sputtering, chemical vapor deposition (CVD) and vapor deposition are listed.

According to a preferred embodiment, the arithmetic average roughness Ra of the surface of the intermediate layer may preferably be 1 nm or smaller and more preferably be 0.3 nm or smaller. The bonding strength of the bonding layer and intermediate layer is thereby further improved. The method of flattening the surface of the intermediate layer includes lapping, chemical mechanical polishing (CMP) and the like.

According to a preferred embodiment, neutralized beam may be used to activate the surface of the piezoelectric single crystal substrate. Particularly, in the case that the surface of the piezoelectric single crystal substrate is a flat surface, the surface may be directly bonded to the bonding layer. However, in the case that the surface of the piezoelectric single crystal substrate is roughened, it is preferred to provide the intermediate layer, to flatten the surface of it and to activate it by neutralized beam. The activated flat surface of the intermediate layer on the piezoelectric single crystal substrate may be directly bonded to the bonding layer on the supporting body.

Further, according to a preferred embodiment, neutralized beam is irradiated onto the flat surface of the bonding layer to activate the flat surface of the bonding layer.

When the activation of the surfaces is performed using the neutralized beam, it is preferred to use a system described in patent document 4 to generate the neutralized beam, which is irradiated. That is, it is used a high speed atomic beam source of saddle field type as the beam source. Then, an inert gas is introduced into the chamber and a high voltage is applied onto electrodes from a direct current electric source. By this, electric field of saddle field type generated between the electrode (positive electrode) and a housing (negative electrode) causes motion of electrons, e, so that atomic and ion beams derived from the inert gas are generated. Among the beams reached at a grid, the ion beam is neutralized at the grid, and the beam of neutral atoms is emitted from the high speed atomic beam source. Atomic species forming the beam may preferably be an inert gas (argon, nitrogen or the like).

A voltage during the activation by the irradiation of the beam may preferably be 0.5 to 2.0 kV and current is preferably 50 to 200 mA.

Then, the activated surfaces are contacted and bonded with each other under vacuum atmosphere. The temperature at this time may be ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

Applications of the bonded bodies of the present invention are not particularly limited, and they can be appropriately applied to an acoustic wave device and optical device, for example.

As an acoustic wave device, a surface acoustic wave device, Lamb wave-type device, thin film resonator (FBAR) or the like is known. For example, the surface acoustic wave device is produced by providing an input side IDT (Inter-digital transducer) electrodes (also referred to as comb electrodes or interdigitated electrodes) for oscillating surface acoustic wave and IDT electrode on the output side for receiving the surface acoustic wave, on the surface of the piezoelectric single crystal substrate. By applying high frequency signal on the IDT electrode on the input side, electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A metal film may be provided on a bottom surface of the piezoelectric single crystal substrate. After the Lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surfaces of the piezoelectric single crystal surface and the metal film on the piezoelectric substrate is exposed through a cavity provided in the supporting body. Materials of such metal films include aluminum, an aluminum alloy, copper, gold or the like, for example. Further, in the case that the Lamb type wave device is produced, it may be used a composite substrate having the piezoelectric single crystal substrate without the metal film on the bottom surface.

Further, a metal film and an insulating film may be provided on the bottom surface of the piezoelectric single crystal substrate. The metal film plays a role of electrodes in the case that the thin film resonator is produced as the acoustic wave device. In this case, the thin film resonator has the structure that electrodes are formed on the upper and bottom surfaces of the piezoelectric substrate and the insulating film is made a cavity to expose the metal film on the piezoelectric substrate. Materials of such metal films include molybdenum, ruthenium, tungsten, chromium, aluminum or the like, for example. Further, materials of the insulating films include silicon dioxide, phosphorus silicate glass, boron phosphorus silicate glass or the like.

Further, as the optical device, it may be listed an optical switching device, wavelength conversion device and optical modulating device. Further, a periodic domain inversion structure may be formed in the piezoelectric single crystal substrate.

In the case that the present invention is applied to the optical device, the size of the optical device can be reduced. Further, particularly in the case that the periodic domain inversion structure is formed, it is possible to prevent the deterioration of the periodic domain inversion structure by heat treatment. Further, the materials of the bonding layers of the present invention are of high insulation, the generation of domain inversion is prevented during the processing by the neutralized beam before the bonding, and the shape of the domain inversion structure formed in the piezoelectric single crystal substrate is hardly disordered.

EXAMPLES

Example A1

A bonded body was produced, according to the method described referring to FIGS. 1 and 2.

Specifically, a substrate (LT substrate) of lithium tantalate having an orientation flat (OF) part, a diameter of 4 inches and thickness of 250 µm was used as the piezoelectric single crystal substrate 6. As the LT substrate, it was used LT substrate of 46° Y-cut X-propagation LT substrate, in which the direction of propagation of the surface acoustic wave (SAW) is X and the Y-cut plate is rotated in a cutting angle. The surface 6a of the piezoelectric single crystal substrate 6 was mirror-polished to an arithmetic average roughness Ra of 0.3 nm.

Further, as the supporting body 1, it was prepared a body 1 having an OF part, a diameter of 4 inches, a thickness of 230 µm and made of mullite. The arithmetic average roughness Ra and PV value of the surface 1a of the supporting body 1 of mullite were 0.5 nm and 10 nm, respectively. The arithmetic average roughness was measured by an atomic force microscope (AFM) in a visual field of a square of length of 10 µm and a width of 10 µm.

Then, the bonding layer 2 made of mullite was formed in 1.0 µm by CVD method on the surface 1a of the supporting body 1. Ra after the film-formation was 2.0 nm. Then, the bonding layer 2 was subjected to chemical mechanical polishing (CMP) to a thickness of 0.1 µm and Ra of 0.3 nm.

Then, the flat surface 3a of the bonding layer 3 and the surface 6a of the piezoelectric single crystal substrate 6 were cleaned to remove contamination, followed by introduction into a vacuum chamber. The chamber was evacuated to an order of $10^{-6}$ Pa and high speed atomic beam (acceleration voltage of 1 kV and Ar flow rate of 27 sccm) was irradiated onto the bonding surfaces of the respective substrates for 120 sec. Then, the beam-irradiated surface (activated surface) 4 of the bonding layer 3A and activated surface 6a of the piezoelectric single crystal substrate 6 were contacted with each other, followed by pressurizing at 10000N for 2 minutes to bond the respective substrates.

Then, the surface 6b of the piezoelectric single crystal substrate 6 was ground and polished until the thickness was changed from the initial thickness of 250 µm to 20 µm (refer to FIG. 2(b)). The separation of the bonded parts was not observed during the grinding and polishing steps. Further, the bonding strength was evaluated by crack opening method and proved to be 1.4 J/m².

Further, as tape peeling test was performed, separation was not observed along the interface between the piezoelectric single crystal substrate and bonding layer and along the interface between the bonding layer and the supporting body. However, the tape peeling test was performed as follows.

A square slit of 2×2 mm is formed in a wafer. The depth of the slit was adjusted so as to penetrate the piezoelectric single crystal and to reach the inside of the supporting body. A testing tape is adhered onto the piezoelectric single crystal substrate. As the testing tape, it was used a viscous tape defined in JIS Z 1522. It was then pressed by fingers for 5 seconds, and the tape was strongly pulled so that the tape was made perpendicular to the substrate until the tape was peeled off.

Example A2 to A4 and Comparative Examples A1 to A4

In the Example A1, abrasives used for processing the surface of the supporting body was changed, so that Ra and PV value of the surface of the supporting body was changed as shown in table 1. The bonded bodies of the Examples A2 to A4 and Comparative Examples A1 to A4 were thus obtained. However, in the Comparative Example A4, the thickness of the bonding layer was changed to 300 µm.

The measurement of the bonding strength and tape peeling test were performed for the thus obtained bonded bodies. The results were shown in Table 1.

TABLE 1

| | Ra of surface of supporting body (nm) | PV value of surface of supporting body (nm) | Thickness of bonding layer (nm) | Bonding Strength (J/m²) | Tape test |
|---|---|---|---|---|---|
| Example A1 | 0.5 | 10 | 100 | 1.4 | No separation |
| Example A2 | 0.8 | 20 | 100 | 1.8 | No separation |
| Example A3 | 3.0 | 30 | 100 | 2.0 | No separation |
| Example A4 | 5.0 | 50 | 100 | 1.4 | No separation |
| Com. Ex. A1 | 0.35 | 5 | 100 | 1.4 | Separated |
| Com. Ex. A2 | 7.0 | 70 | 100 | 0.7 | Separated |
| Com. Ex. A3 | 12.0 | 140 | 100 | 0.2 | Separated |
| Com. Ex. A4 | 12.0 | 140 | 300 | 1.4 | Separated |

Example B

In the Examples A1 to A4 and Comparative Examples A1 to A3, the material of the bonding layer 2 was made alumina, and the film-formation of the bonding layer 2 was performed by sputtering method. The other procedures were same as those in the Example A1 to produce the respective bonded bodies.

As a result, the separation of the bonded parts was not observed during the grinding and polishing steps of the piezoelectric single crystal substrate. Further, the results of the bonding strength by crack opening method and tape peeling test were comparable with those of the Examples A1 to A4 and Comparative Examples A1 to A3.

Example C

In the Examples A1 to A4 and Comparative Examples A1 to A3, the material of the bonding layer 2 was made tantalum pentoxide, and the film-formation of the bonding layer 2 was performed by sputtering method. The other procedures were same as those in the Example A1 to produce the respective bonded bodies.

As a result, the separation of the bonded parts was not observed during the grinding and polishing steps of the piezoelectric single crystal substrate. Further, the results of the bonding strength by crack opening method and tape peeling test were comparable with those of the Examples A1 to A4 and Comparative Examples A1 to A3.

Example D

In the Examples A1 to A4 and Comparative Examples A1 to A3, the material of the bonding layer 2 was made titanium oxide, and the film-formation of the bonding layer 2 was performed by sputtering method. The other procedures were same as those in the Example A1 to produce the respective bonded bodies.

As a result, the separation of the bonded parts was not observed during the grinding and polishing steps of the piezoelectric single crystal substrate. Further, the results of the bonding strength by crack opening method and tape peeling test were comparable with those of the Examples A1 to A4 and Comparative Examples A1 to A3.

Example E

In the Examples A1 to A4 and Comparative Examples A1 to A3, the material of the bonding layer 2 was made niobium pentoxide, and the film-formation of the bonding layer 2 was performed by sputtering method. The other procedures were same as those in the Example Alto produce the respective bonded bodies.

As a result, the separation of the bonded parts was not observed during the grinding and polishing steps of the piezoelectric single crystal substrate. Further, the results of the bonding strength by crack opening method and tape peeling test were comparable with those of the Examples A1 to A4 and Comparative Examples A1 to A3.

Comparative Example F1

In the Example A1, the material of the bonding layer 2 was made silicon nitride, and the film-formation of the bonding layer 2 was performed by sputtering method. The other procedures were same as those in the Example A1 to produce the bonded body.

As a result, the separation of the bonded parts occurred during the grinding and polishing steps of the piezoelectric single crystal substrate. Further, the bonding strength was evaluated by crack opening method and proved to be 0.6 J/m².

Comparative Example F2

In the Example A1, the material of the bonding layer 2 was made aluminum nitride, and the film-formation of the bonding layer 2 was performed by sputtering method. The other procedures were same as those in the Example A1 to produce the bonded body.

As a result, the separation of the bonded parts occurred during the grinding and polishing steps of the piezoelectric single crystal substrate. Further, the bonding strength was evaluated by crack opening method and proved to be 0.5 J/m$^2$.

Comparative Example F3

In the Example A1, the material of the bonding layer 2 was made silicon oxide, and the film-formation of the bonding layer was performed by sputtering method. The other procedures were same as those in the Example A1 to produce the bonded body.

As a result, the separation of the bonded parts occurred during the grinding and polishing steps of the piezoelectric single crystal substrate. Further, the bonding strength was evaluated by crack opening method and proved to be 0.1 J/m$^2$.

The invention claimed is:

1. A bonded body comprising:
a supporting body comprising a ceramic;
a bonding layer provided over a surface of said supporting body and comprising one or more materials selected from the group consisting of mullite, alumina, tantalum pentoxide, titanium oxide and niobium pentoxide;
a piezoelectric single crystal substrate bonded with said bonding layer; and
an intermediate layer between said piezoelectric single crystal substrate and said bonding layer, said intermediate layer comprising one or more materials selected from the group consisting of mullite, alumina, tantalum pent oxide, titanium oxide and niobium pentoxide,
wherein said surface of said supporting body has an arithmetic average roughness Ra of 0.5 nm or larger and 5.0 nm or smaller, and
wherein a surface of said bonding layer and a surface of said intermediate layer are bonded.

2. The bonded body of claim 1, wherein said supporting body comprises a material selected from the group consisting of mullite, cordierite and sialon.

3. The bonded body of claim 1, wherein said intermediate layer is provided on a surface of said piezoelectric single crystal substrate, and wherein said surface of said piezoelectric single crystal substrate has an arithmetic average roughness Ra of 0.05 μm or larger and 0.5 μm or smaller.

4. The bonded body of claim 1, wherein said surface of said bonding layer has an arithmetic average roughness Ra of 1 nm or smaller and wherein said surface of said intermediate layer has an arithmetic average roughness Ra of 1 nm or smaller.

5. The bonded body of claim 1, wherein said piezoelectric single crystal substrate comprises lithium niobate, lithium tantalate or lithium niobate-lithium tantalate solid solution.

6. An acoustic wave device comprising:
said bonded body of claim 1; and
an electrode provided on said piezoelectric single crystal substrate.

* * * * *